United States Patent
Park et al.

(10) Patent No.: US 7,309,957 B2
(45) Date of Patent: Dec. 18, 2007

(54) ORGANIC ELECTROLUMINESCENT DISPLAY DEVICE AND METHOD OF FABRICATING THE SAME

(75) Inventors: Jae-Yong Park, Gyeonggi-do (KR); Sung-Ki Kim, Seoul (KR); Choong-Keun Yoo, Incheon (KR); Ock-Hee Kim, Gyeonggi-do (KR); Nam-Yang Lee, Gyeonggi-do (KR); Kwan-Soo Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 143 days.

(21) Appl. No.: 10/608,232

(22) Filed: Jun. 30, 2003

(65) Prior Publication Data
US 2004/0036410 A1     Feb. 26, 2004

(30) Foreign Application Priority Data
Aug. 20, 2002  (KR)  .............. 10-2002-0049288

(51) Int. Cl.
H01J 1/62        (2006.01)
H01J 63/04       (2006.01)

(52) U.S. Cl. .............. 313/504; 313/506; 313/509; 313/512

(58) Field of Classification Search .............. 313/311, 313/312, 504, 512, 506, 509
See application file for complete search history.

(56) References Cited

U.S. PATENT DOCUMENTS

| | | | | |
|---|---|---|---|---|
| 5,543,685 A | * | 8/1996 | Okamoto et al. | 313/496 |
| 5,661,371 A | * | 8/1997 | Salerno et al. | 315/169.3 |
| 5,834,894 A | * | 11/1998 | Shirasaki et al. | 313/509 |
| 5,869,929 A | * | 2/1999 | Eida et al. | 313/501 |
| 5,909,081 A | * | 6/1999 | Eida et al. | 313/504 |
| 6,121,727 A | * | 9/2000 | Kanai et al. | 313/504 |
| 6,133,581 A | * | 10/2000 | Terao et al. | 257/40 |
| 6,175,345 B1 | | 1/2001 | Kuribayashi et al. | 345/76 |
| 6,445,005 B1 | * | 9/2002 | Yamazaki et al. | 257/72 |
| 6,548,961 B2 | | 4/2003 | Barth et al. | 315/169.3 |

(Continued)

FOREIGN PATENT DOCUMENTS

JP     2001-117509     4/2001

(Continued)

*Primary Examiner*—Nimeshkumar D. Patel
*Assistant Examiner*—Peter Macchiarolo
(74) *Attorney, Agent, or Firm*—Morgan, Lewis & Bockius LLP

(57) ABSTRACT

An organic electroluminescent display device includes first and second substrates bonded together, the first and second substrates having a plurality of pixel regions, a plurality of driving elements on an inner surface of the first substrate within each of the plurality of pixel regions, a plurality of connection electrodes contacting the driving elements, a black matrix on an inner surface of the second substrate at a boundary of each of the plurality of pixel regions, a color filter layer including red, green, and blue color filters on the inner surface of the second substrate, each of the red, green, and blue color filters corresponding to each of the plurality of pixel regions, a first electrode on the black matrix and the color filter layer, an organic electroluminescent layer on the first electrode, and at least one second electrode on the organic electroluminescent layer, wherein the at least one second electrode contacts the connection electrodes.

19 Claims, 15 Drawing Sheets

U.S. PATENT DOCUMENTS

| | | | |
|---|---|---|---|
| 6,911,772 B2* | 6/2005 | Cok | 313/501 |
| 6,967,435 B2* | 11/2005 | Park et al. | 313/501 |
| 2001/0026127 A1* | 10/2001 | Yoneda et al. | 313/506 |
| 2002/0079494 A1 | 6/2002 | Kim et al. | |
| 2002/0158577 A1 | 10/2002 | Shimoda et al. | 313/506 |
| 2003/0160564 A1* | 8/2003 | Park et al. | 313/512 |
| 2003/0201445 A1* | 10/2003 | Park et al. | 257/79 |

FOREIGN PATENT DOCUMENTS

| | | |
|---|---|---|
| JP | 2001-177509 | 4/2001 |
| KR | 2001-0067183 | 7/2001 |
| KR | 2002-0047889 | 6/2002 |
| KR | 2004-0079476 | 9/2004 |
| WO | 01/62051 | 8/2001 |
| WO | WO-02/078101 | 10/2002 |
| WO | WO-02/078101 | 10/2005 |

\* cited by examiner

ORGANIC ELECTROLUMINESCENT DISPLAY DEVICE AND METHOD OF FABRICATING THE SAME

The present invention claims the benefit of Korean Patent Application No. 2002-49288 filed in Korea on Aug. 20, 2002, which is hereby incorporated by reference.

BACKGROUND OF THE INVENTION

1. Field of the Invention

The present invention relates to a display device and a method of fabricating a display device, and more particularly, to an organic electroluminescent display device and a method of fabricating an organic electroluminescent display device.

2. Discussion of the Related Art

In general, organic electroluminescent display (OELD) devices have an electron supply electrode, which is commonly referred to as a cathode, and a hole supply electrode, which is commonly referred to as an anode. The electrons and the holes are supplied to an electroluminescent layer from the cathode and anode, respectively, wherein each pair of the electrons and holes form an exciton. The OELD devices emit light when energy levels of the excitons are reduced from an excited state to a ground state. Accordingly, since OELD devices do not require additional light sources, such as a backlight device as in liquid crystal display (LCD) devices, both volume and weight of the OELD devices may be reduced. In addition, the OELD devices have low power consumption, high luminance, fast response time, and low weight. Presently, the OELD devices are commonly implemented in mobile telecommunication terminals, car navigation systems (CNSs), personal digital assistants (PDAs), camcorders, and palm computers. In addition, since manufacturing processes for the OELD devices are relatively simple as compared to LCD devices, manufacturing costs can be reduced.

The OELD devices may be classified into passive matrix-type OELD devices and active matrix-type OELD devices. Although the passive matrix-type OELD devices have simple structures and manufacturing processes are simple, they have high power consumption and are not suitable for large-sized display devices, and their aperture ratios decrease as a total number of electrical lines increase. On the other hand, the active matrix-type OELD devices have high light-emitting efficiency and high image display quality.

FIG. 1 is cross sectional view of an OELD device according to the related art. In FIG. 1, an OELD device 10 has a transparent first substrate 12, a thin film transistor array part 14, a first electrode 16, an organic electroluminescent layer 18, and a second electrode 20, wherein the thin film transistor array part 14 is formed on the transparent first substrate 12. In addition, a second substrate 28 has a moisture absorbent desiccant 22. The first electrode 16, the organic electroluminescent layer 18, and the second electrode 20 are formed over the thin film transistor array part 14. The electroluminescent layer 18 emits red (R), green (G), and blue (B) colored light, and it is commonly formed by patterning organic material within each pixel region "P" for the R, G, and B colored light.

The OELD 10 is completed by bonding the first and second substrates 12 and 28 together by disposing a sealant 26 between the first and second substrates 12 and 28. The moisture absorbent desiccant 22 on the second substrate 28 removes any moisture and oxygen that may have infiltrated into an interior of the OELD 10. The moisture absorbent desiccant 22 is formed by etching away a portion of the second substrate 28, filling the etched portion of the second substrate 28 with moisture absorbent desiccant material, and affixing the moisture absorbent desiccant material with a tape 25.

FIG. 2 is a plan view of a thin film transistor array part of an OELD device according to the related art. In FIG. 2, each of a plurality of pixel regions "P" defined on a substrate 12 includes a switching element "$T_S$," a driving element "$T_D$," and a storage capacitor "$C_{ST}$." The switching element "$T_S$" and the driving element "$T_D$" may be formed by combinations of more than two thin film transistors (TFTs), and the substrate 12 is formed of a transparent material, such as glass and plastic. In addition, a gate line 32 is formed along a first direction, and a data line 34 is formed along a second direction perpendicular to the first direction, wherein the data line 34 perpendicularly crosses the gate line 32 with an insulating layer provided therebetween. A power line 35 is formed along the second direction, and is spaced apart from the data line 34. The TFT used for the switching element "$T_S$" has a switching gate electrode 36, a switching active layer 40, a switching source electrode 46, and a switching drain electrode 50. The TFT used for the driving element "$T_D$" has a driving gate electrode 38, a driving active layer 42, a driving source electrode 48, and a driving drain electrode 52. Accordingly, the switching gate electrode 36 is electrically connected to the gate line 32, and the switching source electrode 46 is electrically connected to the data line 34. The switching drain electrode 50 is electrically connected to the driving gate electrode 38 through a contact hole 54, and the driving source electrode 48 is electrically connected to the power line 35 through a contact hole 56. The driving drain electrode 52 is electrically connected to a first electrode 16 within the pixel region "P," wherein the power line 35 and a first capacitor electrode 15, which is formed of polycrystalline silicon, form a storage capacitor "$C_{ST}$."

FIG. 3 is a cross sectional view along III-III of FIG. 2 according to the related art. In FIG. 3, the OELD device has a driving thin film transistor (TFT) "$T_D$" and an organic electroluminescent (EL) diode "$D_{EL}$." The driving TFT "$T_D$" has a driving gate electrode 38, a driving active layer 42, a driving source electrode 56, and a driving drain electrode 52. In addition, a first electrode 16 is formed over the driving TFT "$T_D$" and is connected to the driving drain electrode 52 with an insulating layer 57 therebetween. The organic EL diode "$D_{EL}$" includes the first electrode 16, an organic electroluminescent (EL) layer 18, and a second electrode 20. The organic EL layer 18 is formed on the first electrode 16 for emitting light of a particular color wavelength, and the second electrode 20 is formed on the organic EL layer 18. A storage capacitor "$C_{ST}$" is connected in parallel to the driving TFT "$T_D$," and includes first and second capacitor electrodes 15 and 35. The driving source electrode 56 contacts the second capacitor electrode 35, i.e., a power line, and the first capacitor electrode 15 is formed of polycrystalline silicon material under the second capacitor electrode 35. The second electrode 20 is formed on the substrate 12 upon which the driving TFT "$T_D$," the storage capacitor "$C_{ST}$," and the organic electroluminescent layer 18 are formed. Adjacent pixel regions may be divided by a sidewall.

OELD devices are classified into bottom emission-type OELD devices and top emission-type OELD devices according to a transparency of the first and second electrodes 16 and 20 of the organic EL diode "$D_{EL}$." While the bottom emission-type OELD devices have high image stability and variable fabrication processing due to encapsulation, they are not adequate for implementation in devices that require high image resolution due to limitations of increased aperture ratio. On the other hand, since top emission-type OELD devices emit light upward through the substrate, the light can be emitted without influencing the TFT array part that is positioned under the organic EL layer. Accordingly, design of the TFT may be simplified and aperture ratio can be increased, thereby increasing operational life span of the OELD device. However, since a cathode is commonly formed over the organic EL layer in the top emission-type OELD devices, material selection and light transmittance are limited and light transmission efficiency is lowered. If a thin film-type passivation layer is formed to prevent a reduction of the light transmittance, the thin film-type passivation layer may fail to prevent infiltration of exterior air into the device.

SUMMARY OF THE INVENTION

Accordingly, the present invention is directed to an organic electroluminescent display device and a method of fabricating an organic electroluminescent display device that substantially obviate one or more of the problems due to limitations and disadvantages of the related art.

An object of the present invention is to provide a dual panel-type organic electroluminescent display device having an array element substrate and an organic electroluminescent diode substrate.

Another object of the present invention is to provide a method of fabricating a dual panel-type organic electroluminescent display device having an array element substrate and an organic electroluminescent diode substrate.

Another object of the present invention is to provide an organic electroluminescent display device that has improved production yield, high color purity, high aperture ratio, high image resolution, and high reliability.

Another object of the present invention is to provide a method of fabricating an organic electroluminescent display device that has improved production yield, high color purity, high aperture ratio, high image resolution, and high reliability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescent display device includes first and second substrates bonded together, the first and second substrates having a plurality of pixel regions, a plurality of driving elements on an inner surface of the first substrate within each of the plurality of pixel regions, a plurality of connection electrodes contacting the driving elements, a black matrix on an inner surface of the second substrate at a boundary of each of the plurality of pixel regions, a color filter layer including red, green, and blue color filters on the inner surface of the second substrate, each of the red, green, and blue color filters corresponding to each of the plurality of pixel regions, a first electrode on the black matrix and the color filter layer, an organic electroluminescent layer on the first electrode, and at least one second electrode on the organic electroluminescent layer, wherein the at least one second electrode contacts the connection electrodes.

In another aspect, a method of fabricating an organic electroluminescent display device includes forming a plurality of driving elements on a first substrate having a plurality of pixel regions, forming a connection pattern contacting the driving elements, forming black matrix on a second substrate having the plurality of pixel regions, the black matrix being formed along a boundary of each of the plurality of pixel regions, forming a color filter layer including red, green, and blue color filters on a second substrate, each of the red, green, and blue color filters corresponding to each of the plurality of pixel regions, forming a first electrode on the black matrix and the color filter layer, forming an organic electroluminescent layer on the first electrode, forming at least one second electrode on the organic electroluminescent layer, and bonding the first and second substrates together, wherein the connection pattern contacts the at least one second electrode.

In another aspect, an organic electroluminescent display device includes first and second substrates bonded together, the first and second substrates having a plurality of pixel regions, a plurality of driving elements on an inner surface of the first substrate within each of the plurality of pixel regions, a first electrode connected to the driving elements, an organic electroluminescent layer on the first electrode, at least one second electrode on the organic electroluminescent layer, a black matrix on an inner surface of the second substrate along a boundary of each of the plurality of pixel regions, and a color filter layer including red, green, and blue color filters on the inner surface of the second substrate, each of the red, green, and blue color filters corresponding to each of the plurality of pixel regions.

In another aspect, a method of fabricating an organic electroluminescent display device includes forming a plurality of driving elements on a first substrate having a plurality of pixel regions, forming a first electrode connected to the driving elements, forming an organic electroluminescent layer on the first electrode, forming a second electrode on the organic electroluminescent layer, forming a black matrix on a second substrate having the plurality of pixel regions, the black matrix being formed along a boundary of each of the plurality of pixel regions, forming a color filter layer including red, green, and blue color filters on the second substrate, each of the red, green, and blue color filters corresponding to each of the plurality of pixel regions, and bonding the first and second substrates together, wherein the color filter layer faces the second electrode.

In another aspect, an organic electroluminescent display device includes a plurality of driving elements on an inner surface of a first substrate within each of a plurality of pixel regions, a plurality of connection electrodes contacting the driving elements, a black matrix on an inner surface of the second substrate at a boundary of each of the plurality of pixel regions, a color filter layer including red, green, and blue color filters on the inner surface of the second substrate, each of the red, green, and blue color filters corresponding to each of the plurality of pixel regions, a first electrode on the black matrix and the color filter layer, an organic electroluminescent layer on the first electrode, and a plurality of second electrodes on the organic electroluminescent layer, wherein each of the second electrodes contact one of the connection electrodes.

In another aspect, an organic electroluminescent display device includes a plurality of driving elements on an inner surface of a first substrate within each of a plurality of pixel regions, a plurality of connection electrodes contacting the driving elements, a black matrix on an inner surface of the second substrate at a boundary of each of the plurality of pixel regions, a color filter layer including red, green, and blue color filters on the inner surface of the second substrate, each of the red, green, and blue color filters corresponding to each of the plurality of pixel regions, a first electrode on the black matrix and the color filter layer, a plurality of sidewalls on the first electrode corresponding to the black matrix, a plurality of organic electroluminescent layer segments on the first electrode between the sidewalls, each of the organic electroluminescent segments include a hole-transporting layer and an electron-transporting layer, and a plurality of second electrodes each on one of the organic electroluminescent layer segments, wherein each of the second electrodes contact one of the connection electrodes.

In another aspect, an organic electroluminescent display device includes a plurality of driving elements on an inner surface of a first substrate within each of a plurality of pixel regions, a plurality of first electrodes contacting each of the driving elements, a black matrix on an inner surface of the second substrate at a boundary of each of the plurality of pixel regions, a color filter layer including red, green, and blue color filters on the inner surface of the second substrate, each of the red, green, and blue color filters corresponding to each of the plurality of pixel regions, a planarization layer on the black matrix and the color filter layer, a second electrode on the planarization layer, and an organic electroluminescent layer on the second electrode, wherein the organic electroluminescent layer contacts each of the first plurality of electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
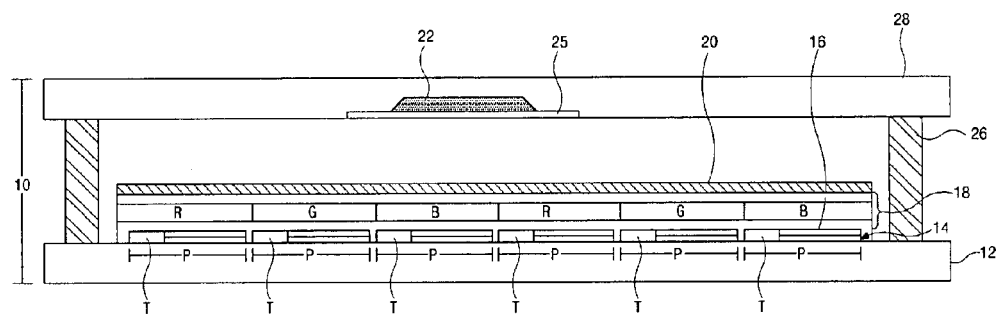
FIG. 1 is cross sectional view of an OELD device according to the related art.
Figure 2:
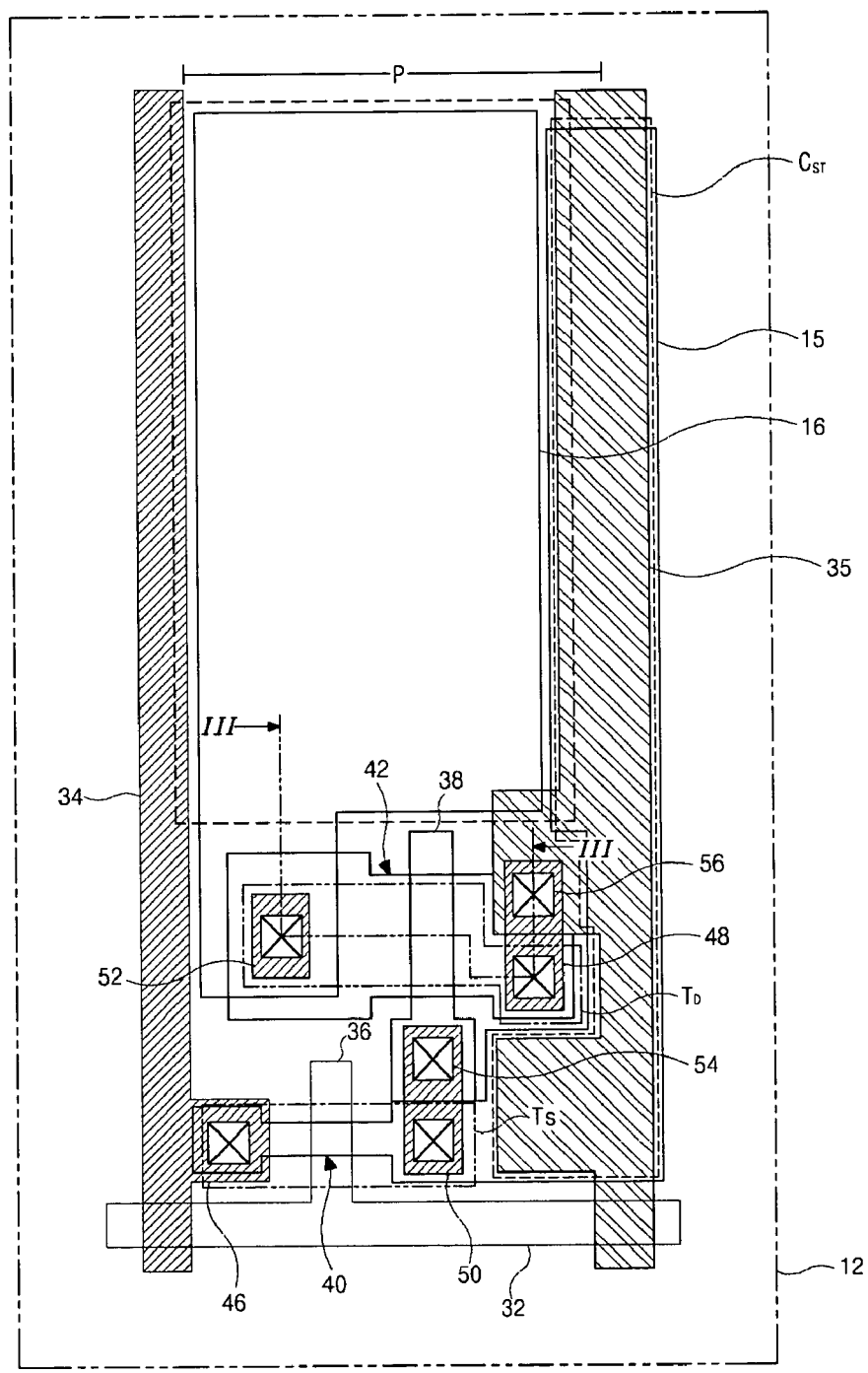
FIG. 2 is a plan view of a thin film transistor array part of an OELD device according to the related art.
Figure 3:
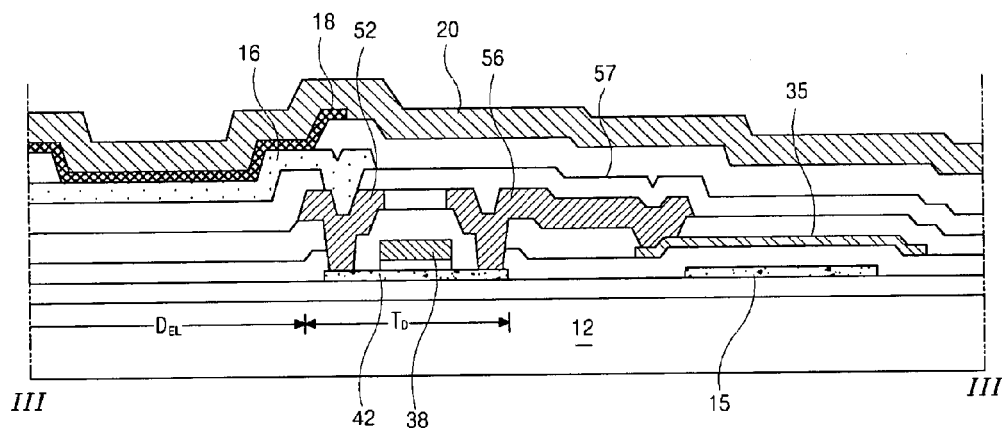
FIG. 3 is a cross sectional view along III-III of FIG. 2 according to the related art.
Figure 4:
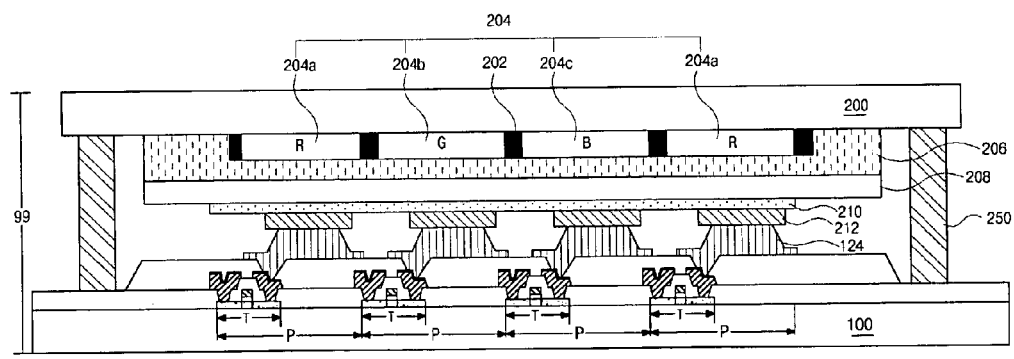
FIG. 4 is a schematic cross sectional view of an exemplary OELD device according to the present invention.

FIG. 4 is a schematic cross sectional view of an exemplary OELD device according to the present invention. In FIG. 4, an OELD device 99 may include first and second substrates 100 and 200 bonded together with a sealant material 250, wherein the first and second substrates 100 and 200 may include a plurality of pixel regions "P." In addition, switching and driving thin film transistors (TFTs) "T" and array lines (not shown) may be formed on an inner surface of the first substrate 100 in each of the pixel regions "P," wherein connection electrodes 124 may contact the driving TFTs "T." Although not shown, the array lines may include a gate line, a data line, a power line, and a common line.

A black matrix 202 and a color filter layer 204 may be formed on an inner surface of the second substrate 200, wherein the black matrix 202 may be disposed along a boundary of each pixel region "P" and the color filter layer 204 may include red (R), green (G), and blue (B) sub color filters 204a, 204b and 204c corresponding to each of the pixel regions "P." In addition, a planarization layer (i.e., overcoat layer) 206 may be formed on the black matrix 202 and the color filter layer 204, and a first electrode 208 may be formed on the planarization layer 206. An organic electroluminescent (EL) layer 210 may be formed on the first electrode 208, and second electrodes 212 may be formed on the organic EL layer 210 at each of the pixel regions "P" to contact the connection electrodes 124 after bonding of the first and second substrates 100 and 200.

The organic EL layer 210 may emit white colored light, i.e., light including wavelengths corresponding to red, green, and blue colors. Accordingly, the organic EL layer 210 may be formed as one body within the R, G, and B pixel regions "P," while the second electrodes 212 may be separately formed within each of the pixel regions "P" using a shadow mask. Since the light emitted from the organic EL layer 210 may be transmitted through the color filter layer 204, images having high color purity may be obtained. Moreover, a high aperture ratio may be obtained since the OELD device 99 is a top emission-type OELD device. In addition, since the organic EL diode "$D_{EL}$" is formed over the second substrate 200, production yields may be improved.

Figure 5A:
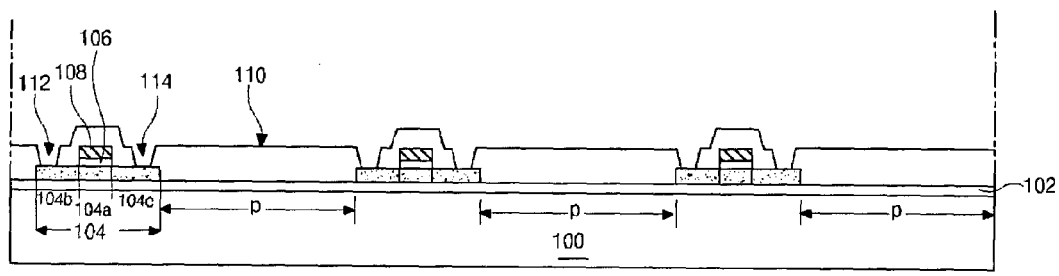
FIGS. 5A to 5C are schematic cross sectional views of an exemplary method of fabricating a first substrate of an OELD device according to the present invention.
Figure 5B:
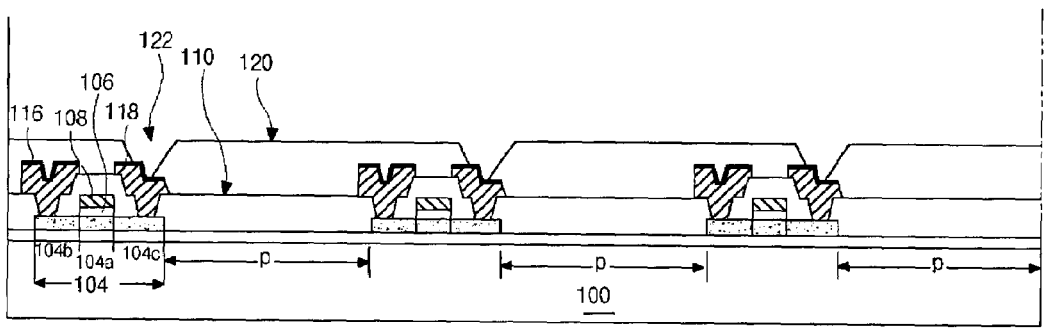
Figure 5C:
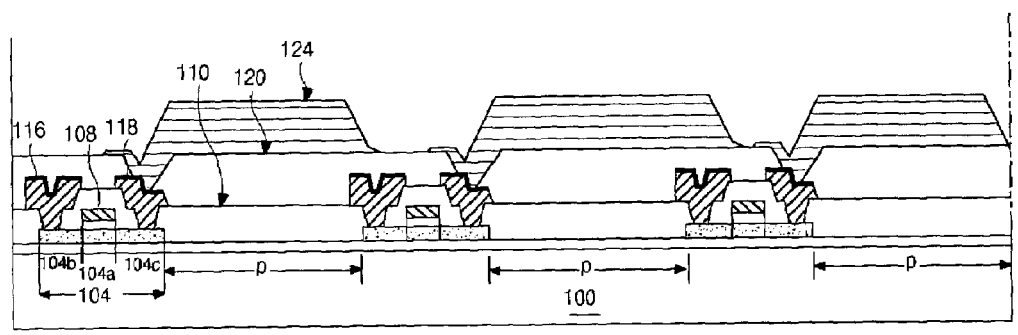

FIGS. 5A to 5C are schematic cross sectional views of an exemplary method of fabricating a first substrate of an OELD device according to the present invention. In FIG. 5A, a first insulating layer (i.e., buffer layer) 102 may be formed on a first substrate 100 having a plurality of pixel regions "P" by depositing inorganic insulating material(s), such as silicon nitride ($SiN_x$) and silicon oxide ($SiO_x$). Then, an amorphous silicon (i.e., a-Si:H) layer (not shown) may be formed on the first insulating layer 102, and crystallized to become a polycrystalline silicon layer (not shown). Accordingly, an active layer 104 including a channel region 104a, and source and drain regions 104b and 104c formed at both sides of the channel region 104a may be obtained by patterning the polycrystalline silicon layer. In addition, a dehydrogenation process may be performed before the crystallization process, wherein the crystallization process may be performed using heat and/or light.

A second insulating layer (i.e., gate insulating layer) 106 may be formed on the active layer 104 by depositing inorganic insulating material(s), such as silicon nitride ($SiN_x$) and silicon oxide ($SiO_x$). The second insulating layer 106 may be formed on an entire surface of the first substrate 100 without any subsequent etch process, or may be etched to have the same shape as a gate electrode 108. After forming the gate electrode 108 on the second insulating layer 106 over the active layer 104, the source and drain regions 104b and 104c of the active layer 104 may be doped with impurities, such as boron (B) or phosphorous (P).

A third insulating layer (i.e., interlayer insulating layer) 110 having first and second contact holes 112 and 114 may be formed on the gate electrode 108. Accordingly, the first and second contact holes 112 and 114 may expose portions of the source and drain regions 104b and 104c of the active layer 104, respectively.

The gate electrode 108 may include at least one of aluminum (Al), an aluminum (Al) alloy, copper (Cu), tungsten (W), tantalum (Ta), and molybdenum (Mo), and the third insulating layer 110 may include inorganic insulating material(s), such as silicon nitride ($SiN_x$) and silicon oxide ($SiO_x$).

In FIG. 5B, source and drain electrodes 116 and 118 may be formed on the third insulating layer 110 by depositing and patterning at least one conductive metallic material, such as aluminum (Al), an aluminum (Al) alloy, copper (Cu), tungsten (W), tantalum (Ta), and molybdenum (Mo). Accordingly, the source and drain electrodes 116 and 118 may be connected to the source and drain regions 104b and 104c of the active layer 104, respectively.

A fourth insulating layer (i.e., passivation layer) 120 may be formed on the source and drain electrodes 116 and 118 by depositing one of inorganic insulating material(s), such as silicon nitride ($SiN_x$) and silicon oxide ($SiO_x$) and organic insulating material(s), such as benzocyclobutene (BCB) and an acrylic resin. Accordingly, the fourth insulating layer 120 may have a drain contact hole 122 exposing the drain electrode 118.

In FIG. 5C, a connection electrode 124 contacting the drain electrode 118 may be formed on the fourth insulating layer 120 in each of the pixel regions "P."

Although the driving TFT "T" may have a coplanar polysilicon structure, as shown in FIGS. 4 and 5A to 5C, the driving TFT "T" may be made of amorphous silicon.

Figure 6A:
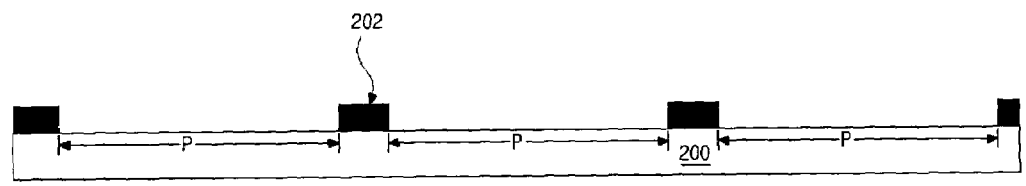
FIGS. 6A to 6C are schematic cross sectional views of an exemplary method of fabricating a second substrate of an OELD device according to the present invention.
Figure 6B:
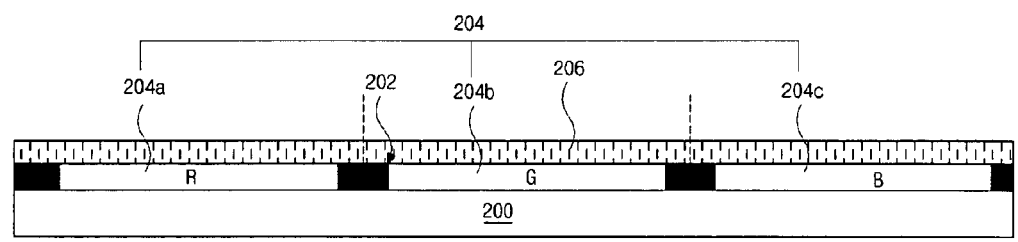
Figure 6C:
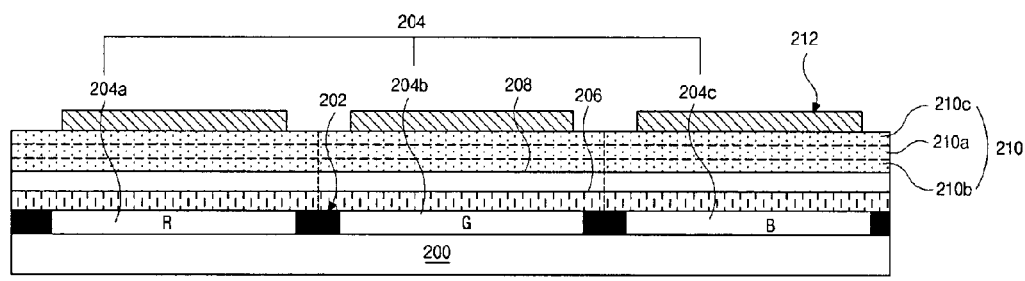

FIGS. 6A to 6C are schematic cross sectional views of an exemplary method of fabricating a second substrate of an OELD device according to the present invention. In FIG. 6A, a black matrix 202 may be formed on a second substrate 200 having a plurality of pixel regions "P," wherein the black matrix 202 may be disposed along a boundary of each of the pixel regions "P."

In FIG. 6B, a color filter layer 204 including red, green, and blue sub color filters 204a, 204b, and 204c may be formed on the second substrate 200. Although not shown, the color filter layer 204 may be formed to cover the black matrix 202, wherein each sub color filter 204a, 204b, or 204c may be disposed within the pixel regions "P." A planarization layer (i.e., overcoat layer) 206 may be formed on the black matrix 202 and the color filter layer 204 by coating organic insulating material(s), such as benzocyclobutene (BCB) and an acrylic resin.

In FIG. 6C, a first electrode 208 may be formed on the planarization layer 206 and an organic electroluminescent (EL) layer 210 for emitting white colored light may be formed on the first electrode 208. In addition, second electrodes 212 may be formed on the organic EL layer 210 within each of the pixel regions "P." The first electrode 208 may include transparent conductive metallic material(s), such as indium-tin-oxide (ITO) and indium-zinc-oxide (IZO).

The organic EL layer 210 may be formed of a single layer structure or of a multiple layer structure. In the multiple layer structure, the organic EL layer 210 may include a hole-transporting layer 210b formed on the first electrode 208, an emission layer 210a formed on the hole-transporting layer 210b, and an electron-transporting layer 210c formed on the emission layer 210a. The organic EL layer 210 may be formed as a single layered structure across the R, G, and B pixel regions "P," or the organic EL layer 210 may be formed as multiple individual structures within each of the pixel regions "P" using a shadow mask. In addition, the second electrodes 212 may be formed of a single layer structure including at least one of aluminum (Al), calcium (Ca) and magnesium (Mg), or the second electrodes 212 may be formed of a multiple layer structure including lithium fluorine/aluminum (LiF/Al). Moreover, the second electrode 212 may be independently formed within each of the pixel regions "P" using a shadow mask.

Accordingly, an OELD device may be obtained by bonding the exemplary first and second substrates 100 and 200 fabricated through processes of FIGS. 5A to 6C.

Figure 7:
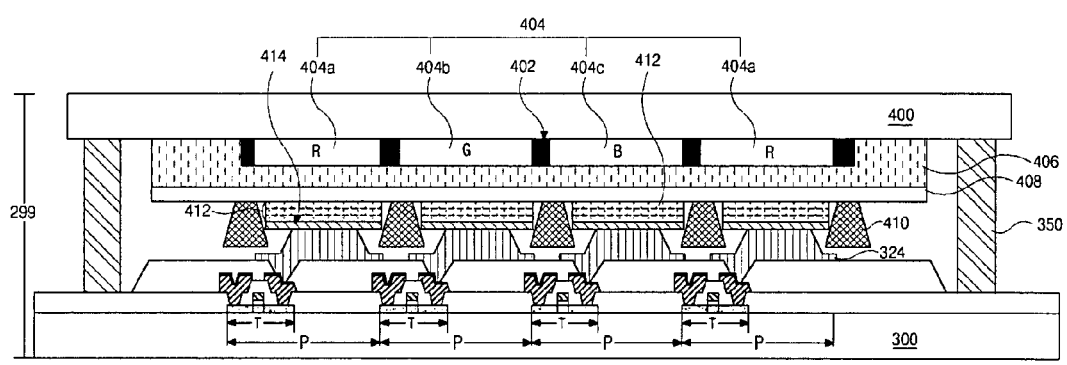
FIG. 7 is a schematic cross sectional view of another exemplary OELD device according to the present invention.

FIG. 7 is a schematic cross sectional view of another exemplary OELD device according to the present invention. In FIG. 7, an OELD device 299 may include first and second substrates 300 and 400 bonded together with a sealant material 350, wherein the first and second substrates 300 and 400 may include a plurality of pixel regions "P." In addition, switching and driving thin film transistors (TFTs) "T" and array lines (not shown) may be formed on an inner surface of the first substrate 300 within each of the pixel regions "P" and connection electrodes 324 may contact each of the driving TFTs "T." Although not shown, the array lines may include a gate line, a data line, a power line, and a common line.

In FIG. 7, a black matrix 402 and a color filter layer 404 may be formed on an inner surface of the second substrate 400, wherein the color filter layer 404 may include red (R), green (G), and blue (B) sub color filters 404a, 404b, and 404c corresponding to each of the pixel regions "P," and the black matrix 402 may be disposed along a boundary of each of the pixel regions "P."

A planarization layer (i.e., overcoat layer) 406 may be formed on the black matrix 402 and the color filter layer 404, and a first electrode 408 may be formed on the planarization layer 406. In addition, a plurality of sidewalls 410 corresponding to the boundary of each of the pixel regions "P" may be formed on the first electrode 408.

A plurality of organic electroluminescent (EL) layers 412 for emitting white colored light may separately formed on the first electrode 408 between the sidewalls 410 of each of the pixel regions "P." In addition, a plurality of second electrodes 414 may be separately formed on each of the organic EL layers 412 at each of the pixel regions "P." Since the organic EL layers 412 and the second electrodes 414 are separately formed in each of the pixel regions "P" between the sidewalls 410, it may not be necessary to use a shadow mask. Accordingly, the second electrodes 414 contact the connection electrodes 224 after bonding the first and second substrates 300 and 400 together.

Figure 8A:
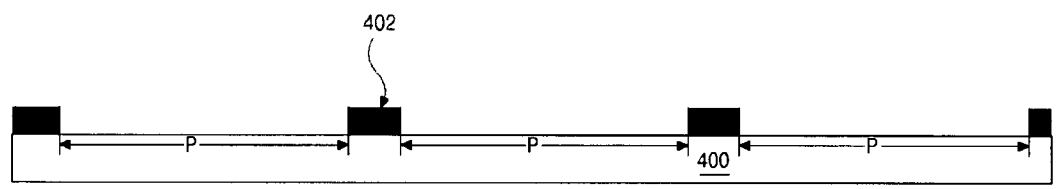
FIGS. 8A to 8C are schematic cross sectional views of an exemplary method of fabricating a second substrate of an OELD device according to the present invention.
Figure 8B:
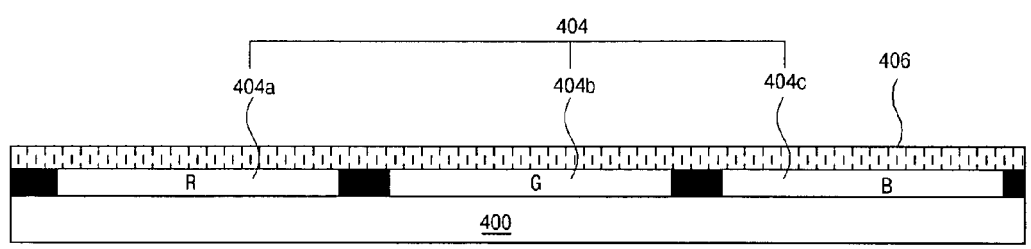
Figure 8C:
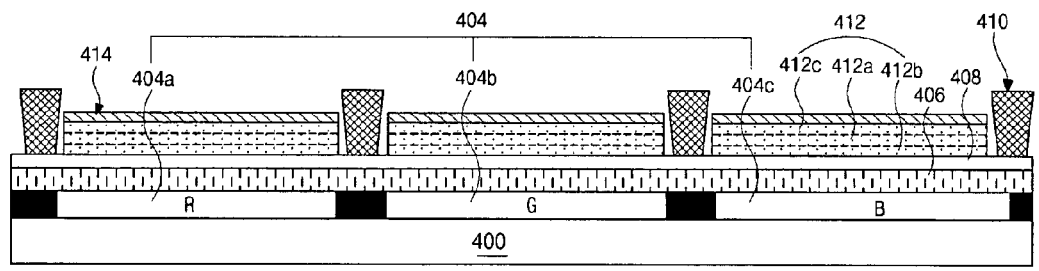

FIGS. 8A to 8C are schematic cross sectional views of an exemplary method of fabricating a second substrate of an OELD device according to the present invention. Since a method of fabricating a first substrate according to FIGS. 8A to 8C may be similar to the method of fabricating a first substrate according to FIGS. 6A to 6C, only a method of fabricating a second substrate of an OELD device according to FIGS. 8A to 8C will be illustrated.

In FIG. 8A, a black matrix 402 may be formed on a second substrate 400 having a plurality of pixel regions "P," wherein the black matrix 402 may be disposed along a boundary of each of the pixel regions "P."

In FIG. 8B, a color filter layer 404 including red, green, and blue sub-color filters 404a, 404b and 404c may be formed on the second substrate 400. Although not shown, the color filter layer 404 may be formed to cover the black matrix 402. Each of the sub-color filters 404a, 404b, or 404c may be disposed in each of the pixel regions "P." Then, a planarization layer (i.e., overcoat layer) 406 may be formed on the black matrix 402 and the color filter layer 404 by coating organic insulating material(s), such as benzocyclobutene (BCB) and an acrylic resin.

In FIG. 8C, a first electrode 408 may be formed on the planarization layer 406, and a plurality of sidewalls 410 corresponding to the boundary of each of the pixel regions "P" may be formed on the first electrode 408. The first electrode 408 may include transparent conductive metallic material(s), such as indium-tin-oxide (ITO) and indium-zinc-oxide (IZO), and the sidewalls 410 may include one of photoresist and transparent organic materials.

Then, a plurality of organic electroluminescent (EL) layers 412 that emit white light may be formed on the first electrode 408 between the sidewall 410s within each of the pixel regions "P." The organic EL layers 412 may include a single layer structure or a multiple layer structure. In case the multiple layer structure, the organic EL layers 412 may each include a hole-transporting layer 412b formed on the first electrode 408, an emission layer 412a formed on the hole-transporting layer 412b, and an electron-transporting layer 412c formed on the emission layer 412a.

Next, a plurality of second electrodes 414 may be formed on each of the organic EL layers 412 between the sidewalls 410 within each of the pixel regions "P." The second electrodes 414 may be a single layer including at least one of aluminum (Al), calcium (Ca), and magnesium (Mg), or may be a double layer structure including lithium fluorine/aluminum (LiF/Al).

Then, an OELD device may be obtained by bonding the first and second substrates 300 and 400 together fabricated through processes of FIGS. 8A to 8C.

Figure 9:
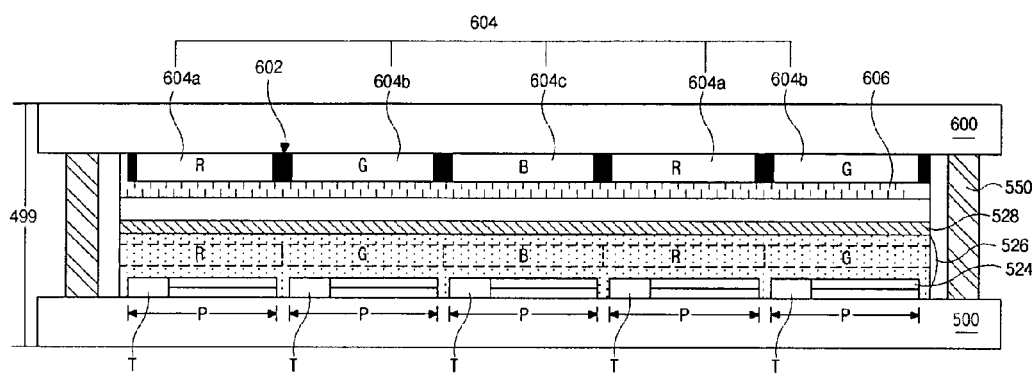
FIG. 9 is a schematic cross sectional view of another exemplary OELD device according to the present invention.

FIG. 9 is a schematic cross sectional view of another exemplary OELD device according to the present invention. In FIG. 9, an OELD device 499 may includes first and second substrates 500 and 600 bonded together with a sealant material 550, wherein the first and second substrates 500 and 600 may have a plurality of pixel regions "P." In addition, switching and driving thin film transistors (TFTs) "T" and array lines (not shown) may be formed on an inner surface of the first substrate 500 within each of the pixel regions "P."

Next, a plurality of first electrodes 524 that contact the driving TFTs "T" may be formed within each of the pixel regions "P," and an organic electroluminescent (EL) layer 526 may be formed on each the first electrodes 524, wherein the organic EL layer 526 emits red, green, and blue colored light within each of the pixel regions "P." Then, a second electrode 528 may be formed on the organic EL layer 526, and may include opaque conductive material(s), such as aluminum (Al) and chromium (Cr). To obtain a top emission-type OELD device, the second electrode 528 may be formed to have a thickness of about several tens of angstroms for light transparency. Furthermore, an additional transparent electrode (not shown) may be formed on the second electrode 528.

Then, a black matrix 602 and a color filter layer 604 may be formed on an inner surface of the second substrate 600, wherein the black matrix 602 may be disposed along a boundary of each of the pixel regions "P" and the color filter layer 604 may include red (R), green (G), and blue (B) sub-color filters 604a, 604b, and 604c corresponding to each of the pixel regions "P." Next, a planarization layer (i.e., overcoat layer) 606 may be formed on the black matrix 602 and the color filter layer 604.

The organic EL layer 526 may emit one of red, green, and blue colored light and may be separately formed within each of the pixel regions "P," and one of the sub-color filters 604a, 604b, or 604c corresponding to a specific color may be disposed over the organic EL layer 526. Accordingly, high color purity may be obtained.

Figure 10A:
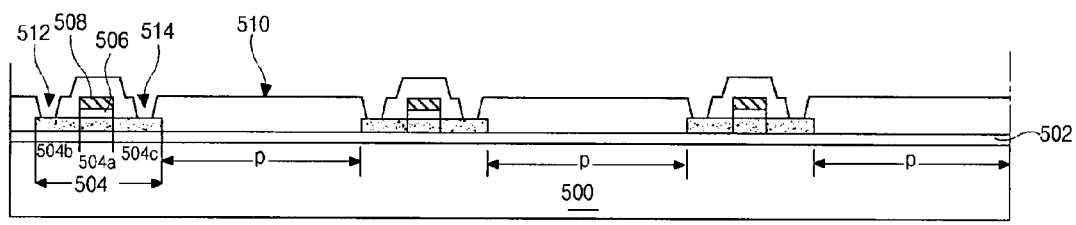
FIGS. 10A to 10C are schematic cross sectional views of an exemplary method of fabricating a first substrate of an OELD device according to the present invention.
Figure 10B:
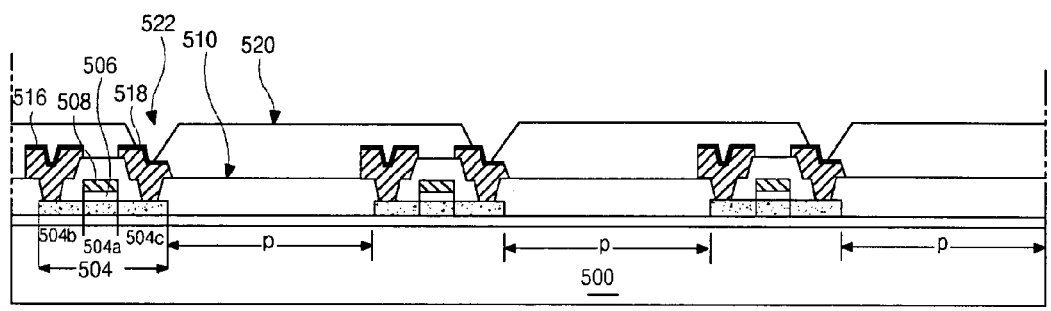
Figure 10C:
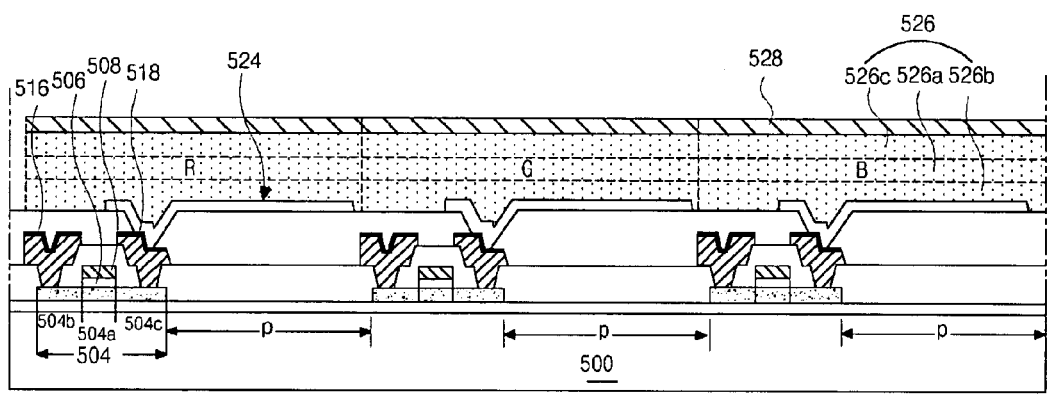

FIGS. 10A to 10C are schematic cross sectional views of an exemplary method of fabricating a first substrate of an OELD device according to the present invention. In FIG. 10A, a first insulating layer (i.e., buffer layer) 502 may be formed on a first substrate 500 having a plurality of pixel regions "P" by depositing inorganic insulating material(s), such as silicon nitride ($SiN_x$) and silicon oxide ($SiO_x$).

Then, an amorphous silicon (i.e., a-Si:H) layer (not shown) may be formed on the first insulating layer 502, and may be crystallized to become polycrystalline silicon (not shown). Next, an active layer 504 including a channel region 504a, and source and drain regions 504b and 504c may be formed at both sides of the channel region 504a by patterning the polycrystalline silicon layer. In addition, a dehydrogenation process may be performed before the crystallization process, wherein the crystallization process may be performed using heat or light.

Next, a second insulating layer (i.e., gate insulating layer) 506 may be formed on the active layer 504 by depositing inorganic insulating material(s), such as silicon nitride ($SiN_x$) and silicon oxide ($SiO_x$). The second insulating layer 506 may be formed on an entire surface of the first substrate 500 without any subsequent etch process, or may be etched to have the same shape as a gate electrode 508 after forming the gate electrode 508. The gate electrode 508 may include conductive metallic material(s), such as aluminum (Al), an aluminum (Al) alloy, copper (Cu), tungsten (W), tantalum (Ta), and molybdenum (Mo). Then, the source and drain regions 504b and 504c of the active layer 504 may be doped with impurities, such as boron (B) or phosphorous (P).

A third insulating layer (i.e., interlayer insulating layer) 510 having first and second contact holes 512 and 514 may be formed on the gate electrode 508, wherein the first and second contact holes 512 and 514 may expose the source and drain regions 504b and 504c of the active layer 504, respectively. The third insulating layer 510 may include inorganic insulating material(s), such as silicon nitride ($SiN_x$) and silicon oxide ($SiO_x$).

In FIG. 10B, source and drain electrodes 516 and 518 may be formed on the third insulating layer 510 by depositing and patterning conductive metallic material(s), such as aluminum (Al), an aluminum (Al) alloy, copper (Cu), tungsten (W), tantalum (Ta), and molybdenum (Mo). Accordingly, the source and drain electrodes 516 and 518 may be connected to the source and drain regions 504b and 504c of the active layer 504, respectively.

A fourth insulating layer (i.e., passivation layer) 520 may be formed on the source and drain electrodes 516 and 518 by depositing inorganic insulating material(s), such as silicon nitride ($SiN_x$) and silicon oxide ($SiO_x$), and/or organic insulating material(s), such as benzocyclobutene (BCB) and an acrylic resin. In addition, the fourth insulating layer 520 may have a drain contact hole 522 to expose the drain electrode 118.

In FIG. 10C, a first electrode 524 connected to the drain electrode 518 is formed on the fourth insulating layer 520, wherein the first electrode 524 may include transparent conductive material(s) having high work function, such as indium-tin-oxide (ITO) and indium-zinc-oxide (IZO). Then, an organic electroluminescent (EL) layer 526 emitting red, green, and blue colored lights within each of the pixel regions "P" may be formed on the first electrode 524. The organic EL layer 526 may be formed of a single layer structure or a multiple layer structure. In case the multiple layer structure, the organic EL layer 526 may include a hole-transporting layer 526b formed on the first electrode 524, an emission layer 526a formed on the hole-transporting layer 526b, and an electron-transporting layer 526c formed on the emission layer 526a.

Next, a second electrode 528 may be formed on the organic EL layer 526. The second electrode 528 may include opaque conductive material(s), such as aluminum (Al) and chromium (Cr) formed to have a thickness of about several tens of angstroms for light transparency. Moreover, an additional transparent electrode (not shown) may be formed on the second electrode 528 to improve hardness of the second electrode 528.

Figure 11A:
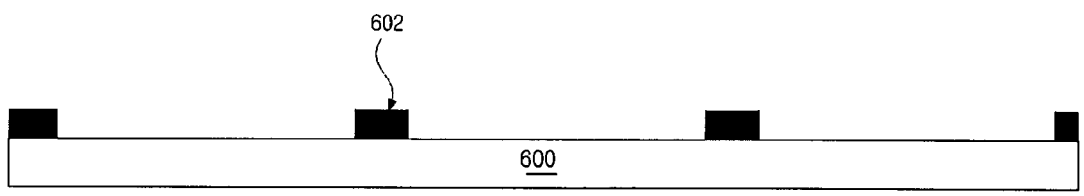
FIGS. 11A and 11B are schematic cross sectional views of an exemplary method of fabricating a second substrate of an OELD device according to the present invention.
Figure 11B:
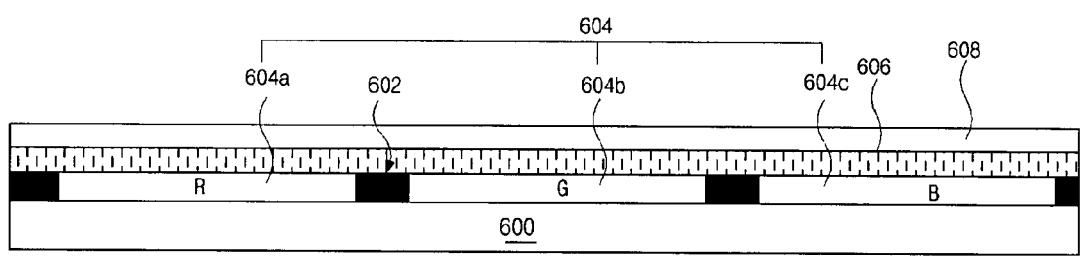

FIGS. 11A and 11B are schematic cross sectional views of an exemplary method of fabricating a second substrate of an OELD device according to the present invention. In FIG. 11A, a black matrix 602 may formed on a second substrate 600 having a plurality of pixel regions, wherein the black matrix 602 may be disposed along a boundary of each of the pixel regions.

In FIG. 11B, a color filter layer 604 including red, green, and blue sub-color filters 604a, 604b, and 604c may be formed on the second substrate 600, wherein each of the sub-color filters 604a, 604b, or 604c may be disposed within the pixel region. Although not shown, the color filter layer 604 may be formed to cover the black matrix 602.

Then, a planarization layer (i.e., overcoat layer) 606 may be formed on the black matrix 602 and the color filter layer 604 by coating organic insulating material(s), such as benzocyclobutene (BCB) and an acrylic resin. Next, a passivation layer 608 may be formed on the planarization layer 606.

Next, an OELD device may be obtained by bonding the first and second substrates 500 and 600 together fabricated through processes of FIGS. 10A to 10C, 11A, and 11B.

Figure 12:
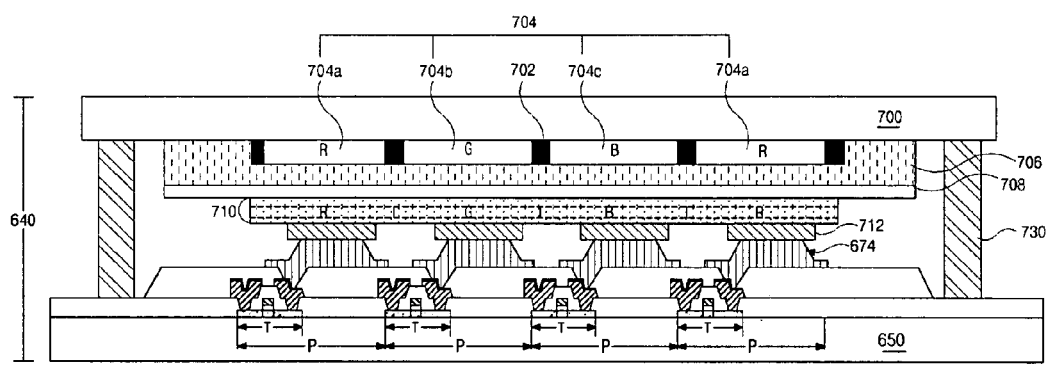
FIG. 12 is a schematic cross sectional view of another exemplary OELD device according to the present invention.

FIG. 12 is a schematic cross sectional view of another exemplary OELD device according to the present invention. In FIG. 12, an OELD device 640 may include first and second substrates 650 and 700 bonded together with a sealant material 730, wherein the first and second substrates 650 and 700 may include a plurality of pixel regions "P." In addition, switching and driving thin film transistors (TFTs) "T" and array lines (not shown) may be formed on an inner surface of the first substrate 650 within each of the pixel regions "P," wherein a plurality of connection electrodes 674 contacts each of the driving TFTs "T." Although not shown, the array lines may include a gate line, a data line, a power line, and a common line.

Next, a black matrix 702 and a color filter layer 704 may be formed on an inner surface of the second substrate 700, wherein the black matrix 702 may be disposed along a boundary of each of the pixel regions "P" and the color filter layer 704 may include red (R), green (G), and blue (B) sub-color filters 704a, 704b, and 704c corresponding to each of the pixel regions "P." Then, a planarization layer (i.e., overcoat layer) 706 may be formed on the black matrix 702 and the color filter layer 704, and a first electrode 708 may be formed on the planarization layer 706.

Next, an organic electroluminescent (EL) layer 710 may be formed on the first electrode 708 using a shadow mask to emit one of red, green, and blue colored light corresponding to the sub-color filter 704a, 704b, or 704c within each of the pixel regions "P." Then, a plurality of second electrodes 712 may be separately formed on the organic EL layer 710 within each of the pixel regions "P," wherein each of the second electrodes 712 may contact each of the connection electrodes 674 after bonding the first and second substrates 650 and 700 together.

Figure 13A:
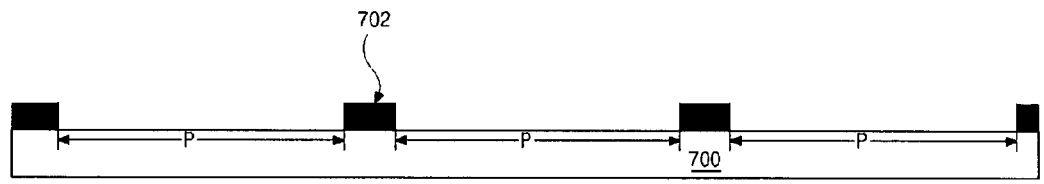
FIGS. 13A to 13C are schematic cross sectional views of an exemplary method of fabricating a second substrate of an OELD device according to the present invention.
Figure 13B:
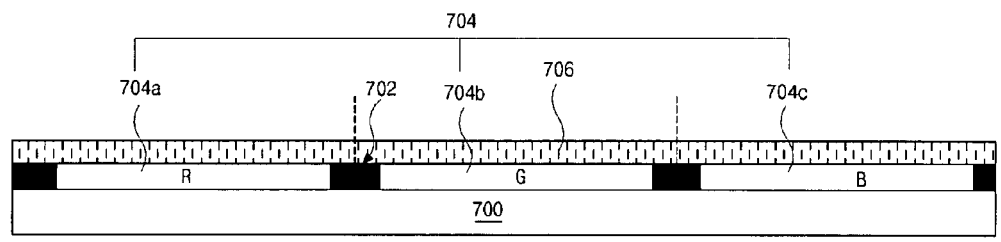
Figure 13C:
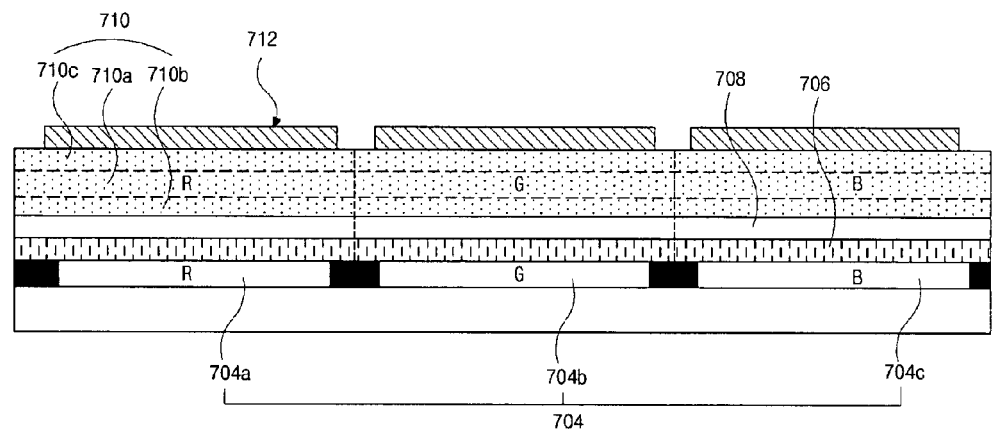

FIGS. 13A to 13C are schematic cross sectional views of an exemplary method of fabricating a second substrate of an OELD device according to the present invention. In FIG. 13A, a black matrix 702 may be formed on a second substrate 700 having a plurality of pixel regions "P," wherein the black matrix 702 may be disposed along a boundary of each of the pixel regions "P."

In FIG. 13B, a color filter layer 704 including red, green, and blue sub-color filters 704a, 704b, and 704c may be formed on the second substrate 700, wherein each of the sub-color filters 704a, 704b, or 704c may be disposed within each of the pixel regions "P." Although not shown, the color filter layer 704 may be formed to cover the black matrix 702.

Next, a planarization layer (i.e., overcoat layer) 706 may be formed on the black matrix 702 and the color filter layer 704 by coating organic insulating material(s), such as benzocyclobutene (BCB) and an acrylic resin.

In FIG. 13C, a first electrode 708 may be formed on the planarization layer 706, and an organic electroluminescent (EL) layer 710 may be formed on the first electrode 708 within each of the pixel regions "P." The organic EL layer 710 may be formed using a shadow mask to emit one of red, green, and blue colored lights corresponding to one of the sub-color filters 704a, 704b, or 704c. The first electrode 708 may include transparent conductive metallic material(s), such as indium-tin-oxide (ITO) and indium-zinc-oxide (IZO). In addition, the organic EL layer 710 may be formed of a single layer structure or a multiple layer structure. In the multiple layer structure, the organic EL layer 710 may include a hole-transporting layer 710b formed on the first electrode 708, an emission layer 710a formed on the hole-transporting layer 710b, and an electron-transporting layer 710c formed on the emission layer 710a.

Next, a plurality of second electrodes 712 may be formed on the organic EL layer 710 within each of the pixel regions "P." The second electrode 712 may include a single layer structure including at least one of aluminum (Al), calcium (Ca), and magnesium (Mg) or may be a double layer structure including lithium fluorine/aluminum (LiF/Al).

Accordingly, an OELD device may be obtained by bonding the first and second substrates 650 and 700 together fabricated through processes of FIGS. 13A to 13C.

Figure 14:
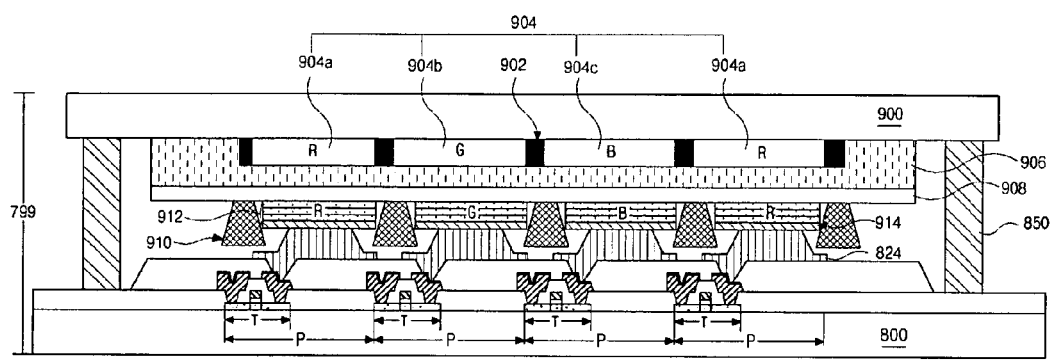
FIG. 14 is a schematic cross sectional view of another exemplary OELD device according to the present invention.

FIG. 14 is a schematic cross sectional view of another exemplary OELD device according to the present invention. In FIG. 14, an OELD device 799 may include first and second substrates 800 and 900 bonded together with a sealant material 850, wherein the first and second substrates 800 and 900 may include a plurality of pixel regions "P." In addition, switching and driving thin film transistors (TFTs) "T" and array lines (not shown) may be formed on an inner surface of the first substrate 800 within each of the pixel regions "P," wherein a plurality of connection electrode 824 may contact each of the driving TFTs "T." Although not shown, the array lines may include a gate line, a data line, a power line, and a common line.

A black matrix 902 and a color filter layer 904 may be formed on an inner surface of the second substrate 900, wherein the black matrix 902 is disposed at a boundary of each pixel region "P," and the color filter layer 904 may include red (R), green (G), and blue (B) sub-color filters 904a, 904b, and 904c corresponding to each of the pixel regions "P." In addition, a planarization layer (i.e, overcoat layer) 906 may be formed on the black matrix 902 and the color filter layer 904, and a first electrode 908 may be formed on the planarization layer 906.

A plurality of sidewalls 910 each corresponding to the boundary of each of the pixel regions "P" may be formed on the first electrode 908, and a plurality of organic electroluminescent (EL) layers 912 emitting white light may be separately formed on the first electrode 908 between the sidewalls 910 within each of the pixel regions "P." In addition, a plurality of second electrodes 914 may be separately formed on each of the organic EL layers 912 within each of the pixel regions "P." Since the organic EL layers 912 and the second electrodes 914 may be separately formed within each of the pixel regions "P" between each of the sidewalls 910, it may not be necessary to use a shadow mask.

Accordingly, the second electrodes 914 may contact the connection electrodes 824 when the first and second substrates 800 and 900 are bonded together.

Figure 15A:
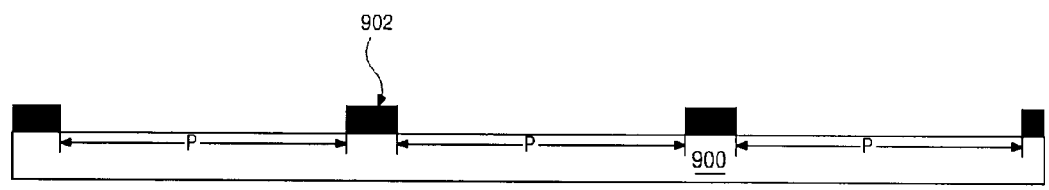
FIGS. 15A to 15C are schematic cross sectional views of an exemplary method of fabricating a second substrate of an OELD device according to the present invention.
Figure 15B:
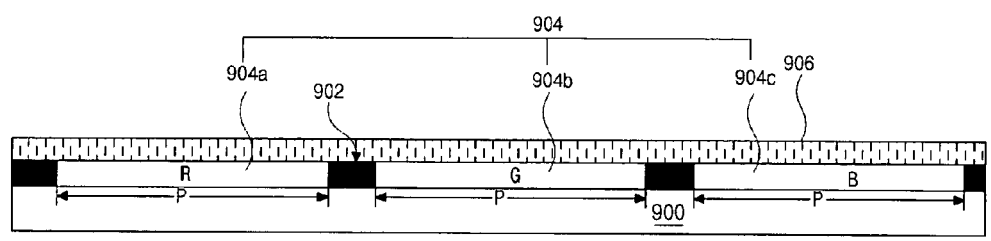
Figure 15C:
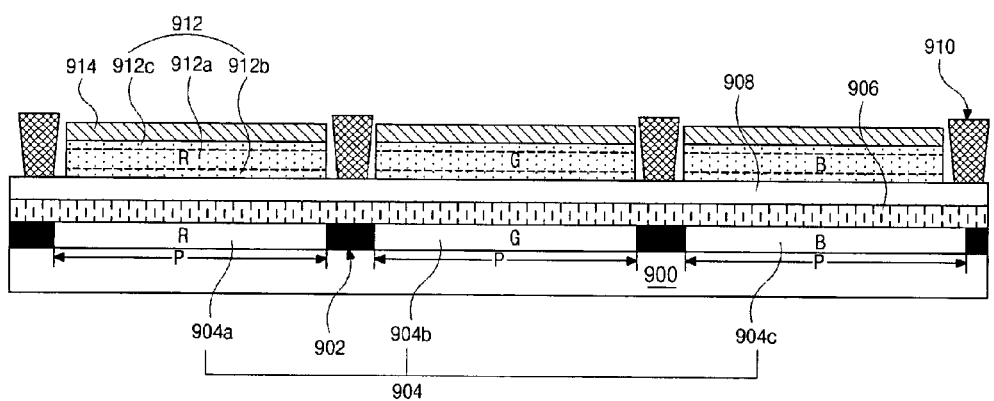

FIGS. 15A to 15C are schematic cross sectional views of an exemplary method of fabricating a second substrate of an OELD device according to the present invention. In FIG. 15A, a black matrix 902 may be formed on a second substrate 900 having a plurality of pixel regions "P," wherein the black matrix 902 may be disposed along a boundary of each of the pixel regions "P."

In FIG. 15B, a color filter layer 904 including red, green, and blue sub-color filters 904a, 904b, and 904c may be formed on the second substrate 900, wherein one of the sub-color filters 904a, 904b, or 904c may be disposed within each of the pixel regions "P." Although not shown, the color filter layer 904 can be formed to cover the black matrix 902. Next, a planarization layer (an overcoat layer) 906 may be formed on the black matrix 902 and the color filter layer 904 by coating organic insulating material(s), such as benzocyclobutene (BCB) and an acrylic resin.

In FIG. 15C, a first electrode 908 may be formed on the planarization layer 906, and a plurality of sidewalls 910 corresponding to the boundary of each of the pixel regions "P" may be formed on the first electrode 908, wherein the sidewalls 910 may include photoresist and/or transparent organic material(s). Next, a plurality of organic electroluminescent (EL) layers 912 emitting one of red, green, and blue colored light may be formed on the first electrode 908 between the sidewalls 910 within each of the pixel regions "P." The first electrode 908 may include transparent conductive metallic material(s), such as indium-tin-oxide (ITO) and indium-zinc-oxide (IZO), and the organic EL layers 912 may be formed of a single layer structure or a multiple layer structure. In the multiple layer structure, the organic EL layers 912 may include a hole-transporting layer 912b formed on the first electrode 908, an emission layer 912a formed on the hole-transporting layer 912b, and an electron-transporting layer 912c formed on the emission layer 912a.

Then, a plurality of second electrodes 914 may be formed on each of the organic EL layers 912 within each of pixel regions "P." The second electrodes 914 may have a single layer structure including one of aluminum (Al), calcium (Ca), and magnesium (Mg), or may be a double layer structure including lithium fluorine/aluminum.

Accordingly, an OELD device may be obtained by bonding the first and second substrates 800 and 900 together fabricated through processes of FIGS. 15A to 15C.

An OELD device according to the present invention has several advantages. First, since the OELD devices include both a color filter layer and an organic EL layer, color purity is improved. Second, since the OELD devices are top emission-type OELD devices, a thin film transistor may be easily designed, and high image resolution and high aperture ratio may be obtained regardless of lower array patterns. Third, since array patterns and an organic EL diode may be formed on respective substrates, production yield and a production management efficiency are improved, and a lifetime of the OELD devices is lengthened.

It will be apparent to those skilled in the art that various modifications and variations can be made in the organic electroluminescent display device and a method of fabricating an organic electroluminescent display device method of the present invention without departing from the spirit or scope of the invention. Thus, it is intended that the present invention cover the modifications and variations of this invention provided they come within the scope of the appended claims and their equivalents.

What is claimed is:

1. An organic electroluminescent display device, comprising:
    first and second substrates bonded together, the first and second substrates having a plurality of pixel regions;
    a plurality of driving elements on an inner surface of the first substrate within each of the plurality of pixel regions;
    a passivation layer on the plurality of driving elements;
    a plurality of connection electrodes contacting the driving elements;
    a black matrix on an inner surface of the second substrate at a boundary of each of the plurality of pixel regions;
    a color filter layer including red, green, and blue color filters on the inner surface of the second substrate, each of the red, green, and blue color filters corresponding to each of the plurality of pixel regions;
    a planarization layer surrounding end portions of the color filter layer and the black matrix;
    a first electrode on an entire surface of the planarization layer;
    an organic electroluminescent layer having a uniform thickness extending on the first electrode; and
    at least one second electrode on the organic electroluminescent layer in at least one of the plurality of pixel regions,
    wherein the at least one second electrode contacts the connection electrodes, wherein the passivation layer and the at least one second electrode are spaced apart from each other to define a space, and wherein the plurality of connection electrodes are disposed in the space between the first and second substrates.

2. The device according to claim 1, wherein the organic electroluminescent layer includes an organic material emitting white light.

3. The device according to claim 1, wherein the organic electroluminescent layer includes an organic material emitting red, green, and blue colored light corresponding to each of the red, green, and blue color filters.

4. The device according to claim 1, further comprising a plurality of sidewalls on the first electrode corresponding to the black matrix.

5. The device according to claim 1, wherein the planarization layer includes a transparent insulating material.

6. The device according to claim 1, wherein the first electrode includes one of a indium-tin-oxide (ITO) and indium-zinc-oxide (IZO).

7. The device according to claim 1, wherein the at least one second electrode includes at least one of aluminum (Al), calcium (Ca), magnesium (Mg), and lithium (Li).

8. The device according to claim 1, wherein the organic electroluminescent layer includes a hole-transporting layer and an electron-transporting layer.

9. The device according to claim 1, wherein the at least one second electrode includes a plurality of the second electrodes.

10. The device according to claim 9, wherein each of the plurality of second electrodes contact each of the connection electrodes.

11. The device according to claim 9, wherein each of the plurality of second electrodes include a double layered structure including lithium flourine and aluminum.

12. A method of fabricating an organic electroluminescent display device, comprising:
  forming a plurality of driving elements on a first substrate having a plurality of pixel regions;
  forming a connection pattern contacting the driving elements;
  forming black matrix on a second substrate having the plurality of pixel regions, the black matrix being formed along a boundary of each of the plurality of pixel regions;
  forming a color filter layer including red, green, and blue color filters on a second substrate, each of the red, green, and blue color filters corresponding to each of the plurality of pixel regions;
  forming a planarization layer surrounding end portions of the color filter layer and the black matrix;
  forming a first electrode on an entire surface of the planarization layer;
  forming an organic electroluminescent layer having a uniform thickness extending on the first electrode;
  forming at least one second electrode on the organic electroluminescent layer in at least one of the plurality of pixel regions; and
  bonding the first substrate having the plurality of driving elements and the second substrates having the at least one second electrode together,
  wherein the connection pattern contacts the at least one second electrode.

13. The method according to claim 12, wherein the organic electroluminescent layer includes an organic material emitting white light.

14. The method according to claim 12, wherein the organic electroluminescent layer includes an organic material emitting red, green, and blue colored lights corresponding to each of the red, green, and blue color filters.

15. The method according to claim 14, further comprising forming a plurality of sidewalls on the first electrode corresponding to the black matrix.

16. The method according to claim 14, wherein the planarization layer includes a transparent insulating material.

17. The method according to claim 14, wherein the organic electroluminescent layer includes a hole-transporting layer and an electron-transporting layer.

18. An organic electroluminescent display device, comprising:
  a plurality of driving elements on an inner surface of a first substrate within each of a plurality of pixel regions;
  a passivation layer on the plurality of driving elements:
  a plurality of connection electrodes contacting the driving elements;
  a black matrix on an inner surface of the second substrate at a boundary of each of the plurality of pixel regions;
  a color filter layer including red, green, and blue color filters on the inner surface of the second substrate, each of the red, green, and blue color filters corresponding to each of the plurality of pixel regions;
  a planarization layer surrounding end portions of the color filter layer and the black matrix;
  a first electrode on an entire surface of the planarization layer;
  an organic electroluminescent layer having a uniform thickness extending on the first electrode; and
  a plurality of second electrodes on the organic electroluminescent layer, each of the plurality of second electrodes in each of the plurality of the pixel regions,
  wherein each of the second electrodes contact one of the connection electrodes, wherein the passivation layer and the plurality of second electrodes are spaced apart from each other to define a space, and wherein the plurality of connection electrodes are disposed in the space between the first and second substrates.

19. An organic electroluminescent display device, comprising:
  a plurality of driving elements on an inner surface of a first substrate within each of a plurality of pixel regions;
  a passivation layer on the plurality of driving elements;
  a plurality of connection electrodes contacting the driving elements;
  a black matrix on an inner surface of the second substrate at a boundary of each of the plurality of pixel regions;
  a color filter layer including red, green, and blue color filters on the inner surface of the second substrate, each of the red, green, and blue color filters corresponding to each of the plurality of pixel regions;
  a planarization layer surrounding end portions of the color filter layer and the black matrix;
  a first electrode on an entire surface of the planarization layer;
  a plurality of sidewalls on the first electrode corresponding to the black matrix;
  a plurality of organic electroluminescent layer segments each having a uniform thickness extending on the first electrode between the sidewalls, each of the organic electroluminescent segments include a hole-transporting layer and an electron-transporting layer; and a plurality of second electrodes each on one of the organic electroluminescent layer segments, each of the plurality of second electrodes in each of the plurality of the pixel regions,
wherein each of the second electrodes contact one of the connection electrodes, wherein the passivation layer and the plurality of second electrodes are spaced apart from each other to define a space, and wherein the plurality of connection electrodes are disposed in the space between the first and second substrates.

* * * * *